(12) United States Patent
Griffin

(10) Patent No.: US 6,667,692 B2
(45) Date of Patent: Dec. 23, 2003

(54) ELECTRICAL UTILITY METER HAVING HARMONIC DATA TEMPLATES FOR POWER QUALITY ALARM THRESHOLDS

(75) Inventor: Paul M. Griffin, Charlotte, NC (US)

(73) Assignee: Landis+Gyr Inc., Lafayette, IN (US)

( * ) Notice: Subject to any disclaimer, the term of this patent is extended or adjusted under 35 U.S.C. 154(b) by 0 days.

(21) Appl. No.: 09/897,791

(22) Filed: Jun. 29, 2001

(65) Prior Publication Data

US 2003/0001747 A1 Jan. 2, 2003

(51) Int. Cl.[7] .............................................. G08B 21/00
(52) U.S. Cl. ..................... 340/658; 340/661; 340/662
(58) Field of Search ................................. 340/658, 657, 340/660, 661, 662, 664, 870.09, 310.01

(56) References Cited

U.S. PATENT DOCUMENTS

| | | | | |
|---|---|---|---|---|
| 3,976,987 A | * | 8/1976 | Anger ........................ 340/651 |
| 4,210,948 A | * | 7/1980 | Waltz ......................... 361/76 |
| 5,047,724 A | | 9/1991 | Boksiner et al. ............ 324/520 |
| 5,298,885 A | | 3/1994 | McEachern et al. ........ 340/660 |
| 5,300,924 A | | 4/1994 | McEachern et al. ........ 340/660 |
| 5,307,009 A | | 4/1994 | McEachern et al. ........ 324/142 |
| 5,365,164 A | * | 11/1994 | Lowenstein et al. ..... 324/76.21 |
| 5,434,509 A | * | 7/1995 | Blades ....................... 324/536 |
| 5,508,623 A | * | 4/1996 | Heydt et al. ................ 324/623 |
| 5,706,204 A | * | 1/1998 | Cox et al. ................... 702/67 |
| 5,754,440 A | | 5/1998 | Cox et al. ................... 702/72 |
| 5,774,366 A | | 6/1998 | Beckwith .................... 702/64 |
| 5,825,656 A | | 10/1998 | Moore et al. ............... 702/60 |
| 5,966,675 A | | 10/1999 | Koeck ......................... 702/58 |
| 6,112,158 A | | 8/2000 | Bond et al. .................. 702/61 |
| 6,185,508 B1 | * | 2/2001 | Van Doorn et al. ......... 702/60 |

* cited by examiner

*Primary Examiner*—Toan Pham
(74) *Attorney, Agent, or Firm*—Maginot, Moore & Beck

(57) ABSTRACT

An electrical utility meter having harmonic data templates advantageously enables a user to determine whether equipment at a particular site is susceptible to electrical damage or interference. According to an exemplary embodiment, the meter generates measured harmonic data for a plurality of phases in the polyphase electrical system. A user may select at least one of a plurality of predetermined templates including one or more harmonic data thresholds. Each of the predetermined templates corresponds to a condition where a specific device is susceptible to electrical damage or interference. The measured harmonic data is compared with the one or more harmonic data thresholds included in the at least one selected predetermined template. An alarm is generated when the measured harmonic data exceeds the one or more harmonic data thresholds included in the at least one selected predetermined template. According to a preferred embodiment, the alarm is generated in dependence upon the specific template whose one or more harmonic data thresholds are exceeded.

28 Claims, 4 Drawing Sheets

ELECTRICAL UTILITY METER HAVING HARMONIC DATA TEMPLATES FOR POWER QUALITY ALARM THRESHOLDS

BACKGROUND OF THE INVENTION

1. Field of the Invention

The present invention generally relates to electrical utility meters, and more particularly, to electrical utility meters suitable for use in polyphase power configurations to detect power quality disturbances.

2. Description of the Related Art

Most electrical utility service providers, or simply utilities, generate polyphase electrical power, and typically three phase power. Polyphase electrical power is alternating current (AC) electrical power that is supplied on a plurality of power supply lines wherein the voltage waveform on each of the power supply lines has a unique phase angle. Polyphase electrical power may be provided to customers in a plurality of wiring configurations. A wiring configuration is defined by the number of wires (e.g., three wire or four wire) and the wiring relationship between the phases (e.g., wye or delta). While only a single phase of the polyphase electrical power may typically be provided for single family residences, true polyphase electrical power is typically provided to larger facilities such as commercial and industrial facilities.

The alternating current (AC) electrical power delivered to residences, commercial facilities and industrial facilities ordinarily approximates a sine wave with respect to time, and typically flows through a residence or facility as an alternating current (AC) that also approximates a sine wave with respect to time. Utilities operate most efficiently and safely when both the voltage and current are sine waves. However, certain types of loads draw current in a non-sinusoidal manner, and if these loads are large relative to the utility's source impedance, the voltage can become non-sinusoidal as well.

These non-sinusoidal voltage and current waveforms may be conveniently expressed as a Fourier series (i.e., a sum of sinusoidal waveforms of varying frequency, amplitude, and phase angle). Under most circumstances, the Fourier series for a utility includes a fundamental frequency, typically 50 or 60 Hertz, plus integer multiples of the fundamental frequency. These integer multiples of the fundamental frequency are referred to as "harmonics."

Instruments for measuring alternating current (AC) power system voltage and current harmonics are well known to those skilled in the art. With the growing popularity of non-linear electrical power loads such as adjustable speed drives, personal computers, arc furnaces and the like, it is often desirable to determine and record whether the level of voltage or current harmonics exceed some limit.

Commercially available instruments such as the Basic Measuring Instruments model 3030 or 3060 can be equipped with a feature that allows a user to program thresholds for voltage and/or current harmonics, and receive an alarm if these thresholds are exceeded. While this type of feature may have benefits in some instances, it fails to provide certain significant functions. For example, such conventional instruments do not provide any guide or pattern (i.e., template) to which the harmonic content of a measured signal may be compared to determine whether equipment at a particular site is susceptible to electrical damage or interference. This type of function is particularly important for sites having loads such as motors, rotating machines and communication equipment that are prone to damage or interference in the presence of specific harmonic conditions. In particular, the use of templates having defined harmonic thresholds enables a user to select a template for their specific type of concern, and if desired, adjust the thresholds to further customize the meter to a particular site. The present invention addresses this and other issues.

SUMMARY OF THE INVENTION

The present invention provides an electrical meter for monitoring electrical conditions in a polyphase electrical system. According to an embodiment, the meter generates measured harmonic data for a plurality of phases in the polyphase electrical system. A user may select at least one of a plurality of predetermined templates including one or more harmonic data thresholds. Each of the predetermined templates may correspond to a condition where a specific device is susceptible to electrical damage or interference. The measured harmonic data is compared with the one or more harmonic data thresholds included in the at least one selected predetermined template. An alarm is generated when the measured harmonic data exceeds the one or more harmonic data thresholds included in the at least one selected predetermined template. According to a preferred embodiment, the alarm is generated in dependence upon the specific template whose one or more harmonic data thresholds are exceeded.

According to another embodiment, the meter generates measured harmonic data for a plurality of phases in the polyphase electrical system. The measured harmonic data is compared with harmonic data thresholds included in a plurality of predetermined templates. Each of the predetermined templates may correspond to a condition where a specific device is susceptible to electrical damage or interference. An alarm is generated when the measured harmonic data exceeds at least one harmonic data threshold included in the plurality of predetermined templates. According to a preferred embodiment, the alarm is generated in dependence upon the specific template whose at least one harmonic data threshold is exceeded.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DETAILED DESCRIPTION OF THE INVENTION

Figure 1:
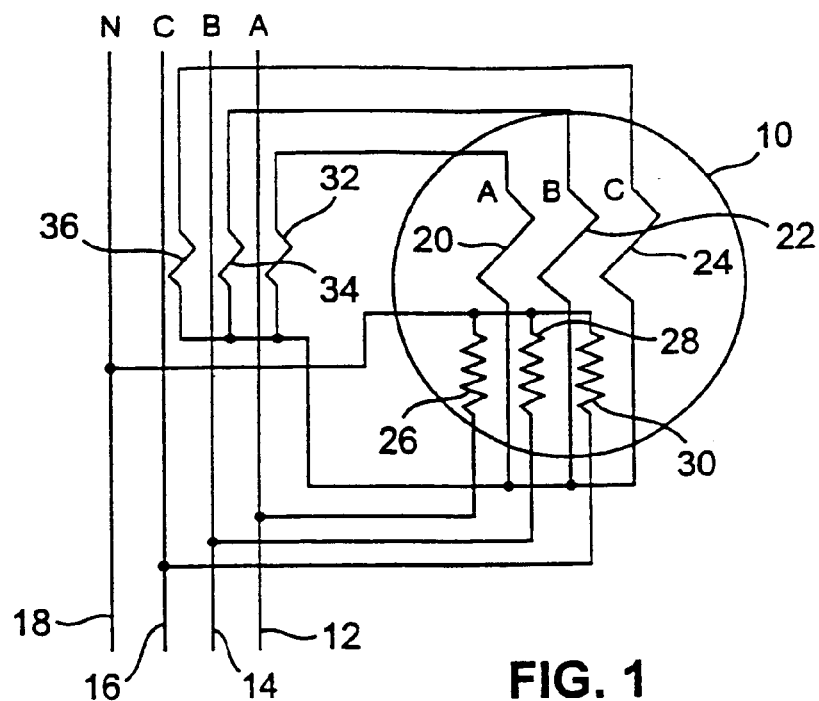
FIG. 1 is a schematic diagram of an exemplary electrical utility meter wired for metering a three-phase electrical power service.

Referring now to the drawings, and more particularly to FIG. 1, a schematic diagram of an exemplary electrical utility meter wired for metering a three-phase electrical power service is shown. Shown in FIG. 1 is a meter 10 and a set of polyphase power lines including a phase A power line 12, a phase B power line 14, a phase C power line 16 and a neutral power line 18. The meter 10 may suitably be a transformer-rated 9S meter form connected to a service type having a four wire wye wiring configuration. The meter 10 includes polyphase sensor means, and particularly, sensor circuitry comprising a phase A current sensor 20, a phase B current sensor 22, a phase C current sensor 24, a phase A voltage sensor 26, a phase B voltage sensor 28 and a phase C voltage sensor 30. The meter 10 includes circuitry, not shown in FIG. 1 (see FIG. 3), that generates current and voltage information from the currents and voltages detected by the current sensors 20, 22 and 24 and the voltage sensors 26, 28 and 30.

The phase A current sensor 20 is connected to a first transformer 32, which is operably situated to detect current on the phase A power line 12. The phase B current sensor 22 is likewise connected to a second transformer 34, which is operably situated to detect current on the phase B power line 14. The phase C current sensor 24 is connected to a third transformer 36, which is operably situated to detect current on the phase C power line 16. The phase A voltage sensor 26 is connected between the phase A power line 12 and the neutral line 18. The phase B voltage sensor 28 is connected between the phase B power line 14 and the neutral line 18. The phase C voltage sensor 30 is connected between the phase C power line 16 and the neutral line 18.

Figure 2:
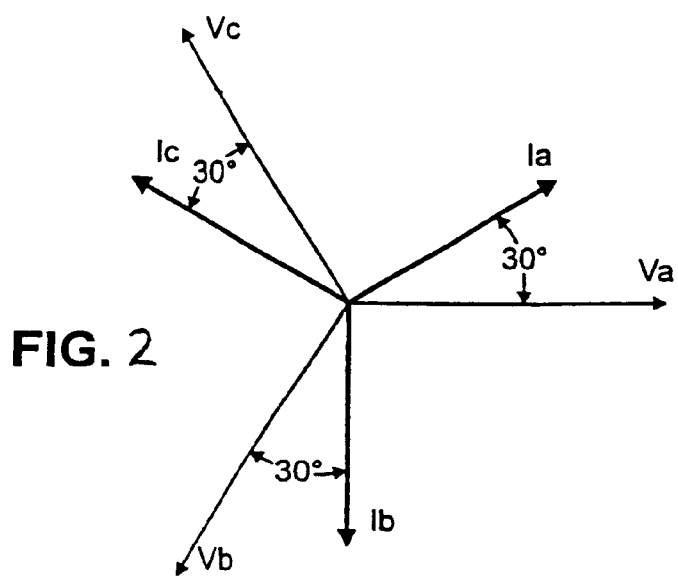
FIG. 2 is a phasor diagram illustrating an exemplary relationship between three voltage and current phases.

Referring to FIG. 2, a phasor diagram illustrating the relationship between three current and voltage phases, such as those detected by the meter 10 of FIG. 1, is shown. Typically, depending on the kind of service, the three current phases will be separated by a phase angle of approximately 120°, as will the three voltage phases. Each phase current and its corresponding phase voltage are typically separated by a relatively small angle, such as 30° as shown in FIG. 2, and sometimes are separated by no angle at all.

Figure 3:
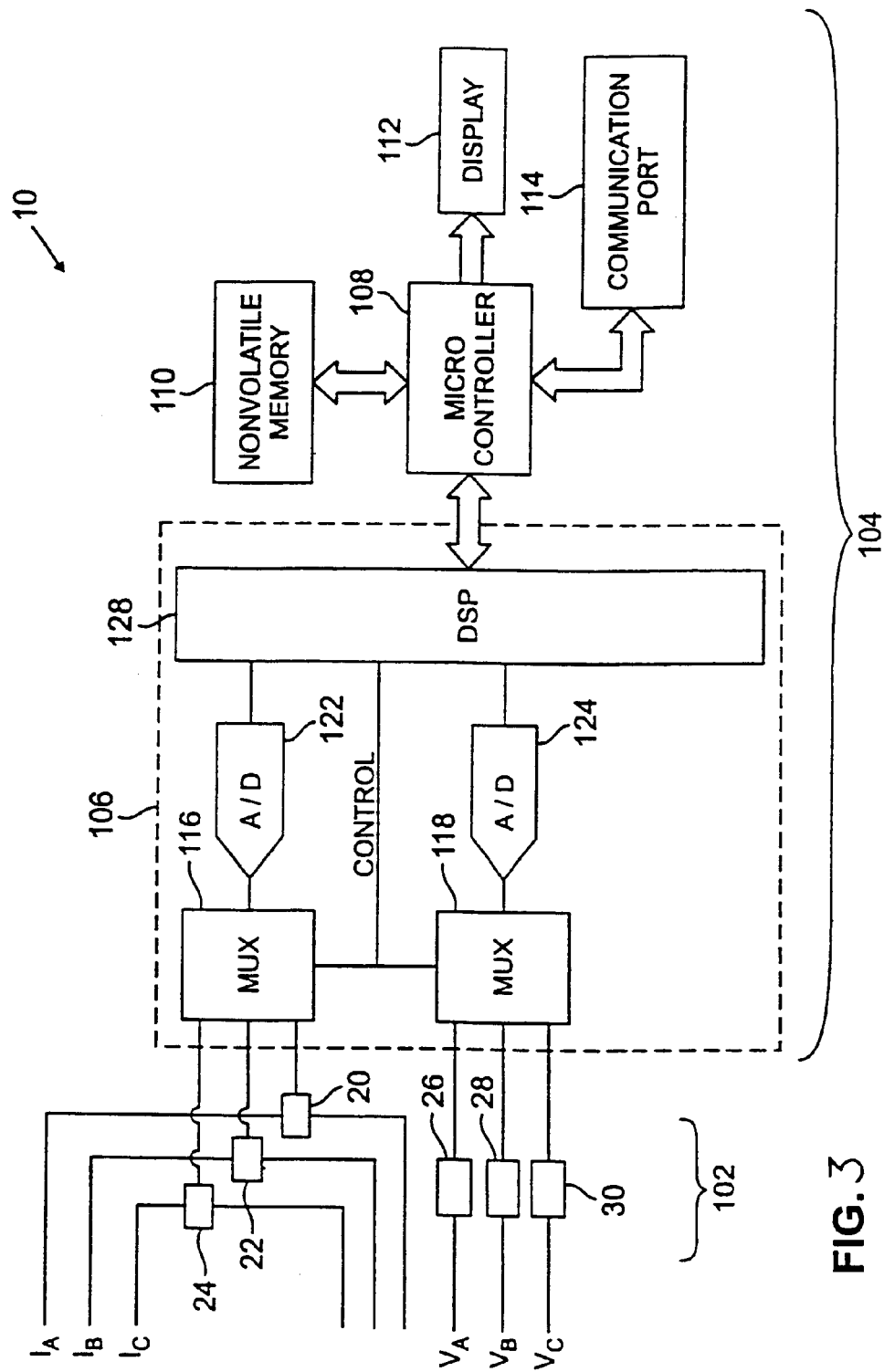
FIG. 3 is a schematic diagram of an exemplary electrical utility meter suitable for practicing the present invention.

Referring now to FIG. 3, a schematic diagram of an exemplary electrical utility meter suitable for practicing the present invention is shown. In FIG. 3, the exemplary meter 10 is a meter intended to, among other things, measure power consumption by a load, not shown, connected to an electric utility, not shown. As will be described herein, the meter 10 is also intended to measure harmonic data included in voltage and current measurement signals, and detect when the measured harmonic data exceeds predetermined thresholds corresponding to conditions where a specific system or device is susceptible to electrical damage or interference.

In the exemplary embodiment discussed herein, the utility provides three phase power to the load through a plurality of power lines, not shown. The load, for example, may be the electrical system of an industrial or commercial facility. The exemplary meter 10 includes sensor circuitry 102 and detection or measurement circuitry 104. The sensor circuitry 102 includes polyphase current sensors 20, 22 and 24, and polyphase voltage sensors 26, 28 and 30. The measurement circuitry 104 includes a conversion circuit 106, a processor or microcontroller 108, a nonvolatile memory 110, a display 112, and a communication port 114. The conversion circuit 106 comprises a first multiplexer 116, a second multiplexer 118, a first analog-to-digital ("A/D") converter 122, a second A/D converter 124 and a digital signal processor ("DSP") 128. It will be noted that a three-phase electrical utility meter is given by way of example only. Those of ordinary skill in the art may readily adapt the inventive aspects of present invention to other types of meters, such as single phase or network meters.

The current sensors 20, 22 and 24 are each connected to receive signals indicative of the current flowing through one phase of a three phase the power line (i.e., phase A, phase B, and phase C). The current sensors 20, 22 and 24 of the exemplary embodiment described herein preferably each include transformers, which are advantageously situated to detect current on each respective phase of the power line. The current sensors 20, 22 and 24 are further connected to the measurement circuit 104 through the first multiplexer 116.

The voltage sensors 26, 28 and 30 are each connected to the respective phase of the power line (i.e., phase A, phase B, and phase C) to obtain a voltage measurement therefrom. To this end, the voltage sensors 26, 28 and 30 may suitably comprise high resistance voltage dividers. The voltage sensors 26, 28 and 30 are further connected to the measurement circuit 104 through the second multiplexer 118.

The conversion circuit 106 is a circuit operable to receive polyphase voltage and polyphase current measurement signals and generate digital signals therefrom. The digital signals include signals representing frequency domain harmonic data corresponding to the polyphase voltage and current measurement signals. The various components of the conversion circuit 106 may suitably be incorporated onto a single semiconductor substrate. An example of a suitable conversion circuit is the Power Measurement Integrated Circuit found in a model S4 electrical utility meters available from Siemens Power Transmission and Distribution, Inc. of Lafayette, Ind.

The microcontroller 108 is operably configured to, and executes programming instructions to, receive the digital signals from the conversion circuit 106, monitor and record the harmonic data represented by the digital signals, and detect when the harmonic data exceeds predetermined thresholds corresponding to conditions where a specific system or device is susceptible to electrical damage or interference. The microcontroller 108 enables generation of a suitable alarm when one or more of the predetermined thresholds are exceeded. The microcontroller 108 may suitably be a K0 series microcontroller available from NEC. The microcontroller 108 generally includes firmware, or in other words, an integrated memory into which programming instructions are stored. Alternatively, the programming instructions may be stored in the nonvolatile memory 110.

In operation, the current sensors 20, 22 and 24 detect the current of each respective phase of the power line and generate phase current measurement signals therefrom. The current sensors 20, 22 and 24 provide the phase current measurement signals to the first multiplexer 116. Each phase current measurement signal is a signal having a voltage level that is indicative of the instantaneous current level on its respective power line. For the embodiment described herein, the phase current measurement signals have a dynamic range of approximately 0.0 volts rms to 0.3 volts rms. Other scaling factors may of course be employed.

The first multiplexer 116, under the control of the microcontroller 108, then provides the instantaneous current measurement signal from one of the phase current measurement signals to the first A/D converter 122. The first multiplexer 116 typically provides each phase in a rapid succession of cycles, such that each phase is provided to the first A/D converter 122 every third cycle. According to the exemplary embodiment described herein, the first multiplexer 116 provides the current measurement signals at a rate of 3.3 kHz.

The first A/D converter 122 receives and samples or digitizes the rapid succession of instantaneous current measurement signals. The first A/D converter 122 then provides to the DSP 128 a stream of digital words, each representing the average magnitude of one of the three phase currents over a particular sampling period.

Contemporaneously, the voltage sensors 26, 28 and 30 detect the phase voltage for each respective phase voltage on the power lines. The voltage sensors 26, 28 and 30 each provide a phase voltage measurement signal to the second multiplexer 118. Each phase voltage measurement signal is typically a signal having a voltage level that is indicative of the instantaneous voltage level on its respective power line. In the exemplary embodiment described herein, the voltage sensors 26, 28 and 30 are configured to provide voltage measurement signals having a dynamic range of approximately 0.0 volts rms to 0.3 volts rms. Other scaling factors may be employed.

The second multiplexer 118 then provides, in serial fashion, the instantaneous phase voltage measurement signal for each respective phase to the second A/D converter 124. The second multiplexer 118 typically provides each phase voltage measurement signal in a rapid succession of cycles, such that each phase is provided to the second A/D converter 124 every third cycle. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals contemporaneously with their corresponding phase voltage measurement signals. For example, in a four wire wye meter configuration, the first multiplexer 116 provides the phase x current measurement signal and the second multiplexer 118 provides the phase x voltage measurement signal contemporaneously, where x rotates among A, B and C. In any event, the second A/D converter 124 receives and samples or digitizes the rapid succession of instantaneous voltage measurement signals. The second A/D converter 124 thus provides to the DSP 128 a stream of digital words, each representing the magnitude of one of the three phase voltage at a particular instant. The first A/D converter 122 and the second A/D converter 124 therefore provide the digital current and voltage measurement signals in a predetermined coordinated phase relationship.

The DSP 128 within the conversion circuit 106 receives the digital current and voltage measurement signals from the first and second A/D converters 122 and 124. The DSP 128 performs a fast Fourier transform ("FFT") in a known manner to convert the digital current and voltage measurement signals from the time-domain to the frequency-domain. This conversion generates harmonic information for the digital current and voltage measurement signals. The harmonic information includes the magnitude and phase of each harmonic present in each of the voltage and current measurement signals. The microcontroller 108 receives the harmonic information for the current and voltage measurement signals from the DSP 128. Using techniques described further below, the microcontroller 108 compares the harmonic information to thresholds to determine whether any of the thresholds have been exceeded.

In accordance with principles of the present invention, the applied thresholds are represented by individual templates. Each template represents a condition where a specific system or device is susceptible to electrical damage or interference. For example, it is contemplated that individual templates may be used for electrical heaters, motors (e.g., rotating machines, etc.), communication systems (e.g., data, voice, etc.), and other systems or devices. According to a preferred embodiment, an individual template includes a plurality of thresholds, each threshold corresponding to a magnitude or phase of an individual harmonic. Further details regarding templates will be provided later herein.

When the microcontroller 108 determines that one or more of the thresholds of a given template has been exceeded by the harmonics observed in the harmonic information provided by the DSP 128, the microcontroller 108 enables an alarm to be generated. According to a preferred embodiment, the alarm generated corresponds to the particular template that has been exceeded. That is, one type of alarm may be generated when a threshold of one template is exceeded, whereas another type of alarm may be generated when a threshold of another template is exceeded. For example, if the template exceeded corresponds to a particular piece of equipment (e.g., a motor), the site where the equipment is located may be contacted via telephone or other communication means to inform the site regarding the condition. Depending on the circumstances (e.g., if template thresholds are exceeded by a given amount), the site may also be instructed to shutdown the equipment until further notification. In less severe situations, data regarding the template threshold violations may simply be stored in a memory such as the non-volatile memory 110 and communicated to the customer at a later time. The number and/or types of alarms that may be utilized in accordance with principles of the present invention is countless, and is simply a matter of design choice.

When one or more of the thresholds of a given template has been exceeded, the microcontroller 108 also provides data regarding this condition to both the non-volatile memory 110 and the display 112. The display 112 then provides a visual representation of the detected condition. The nonvolatile memory 110 stores the data for purposes of retention in the event of a power interruption.

The microcontroller 108 also generally controls the operation of the conversion circuit 106, and particularly, the first and second multiplexers 116 and 118, respectively, the first and second A/D converters 122 and 124, respectively, and the DSP 128. To this end, the DSP 128 provides timing signals and other control signals to the various other elements of the conversion circuit 106 as necessary to carry out the operations described above.

Figure 4A:
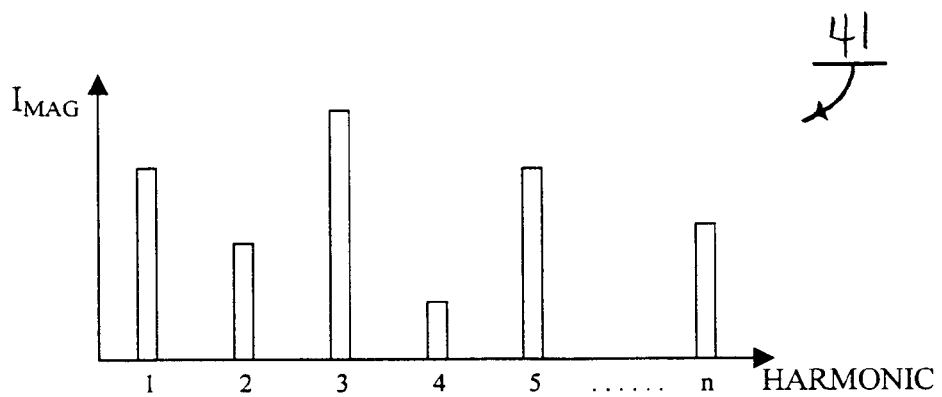
FIGS. 4A through 4C are diagrams illustrating exemplary templates providing harmonic data thresholds in accordance with principles of the present invention.
Figure 4B:
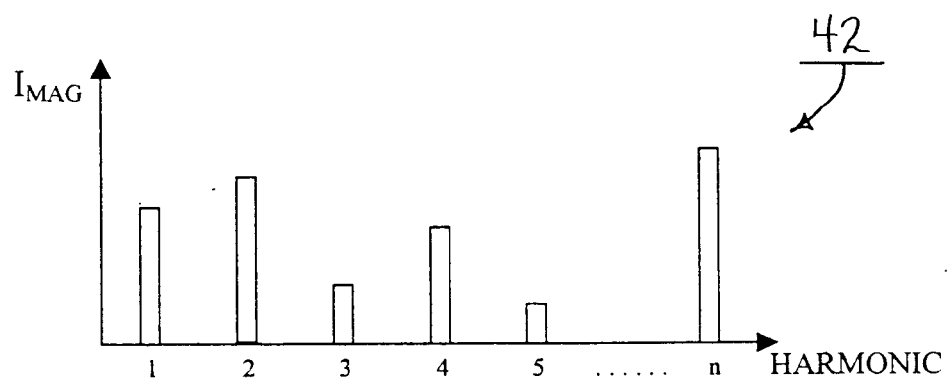
Figure 4C:
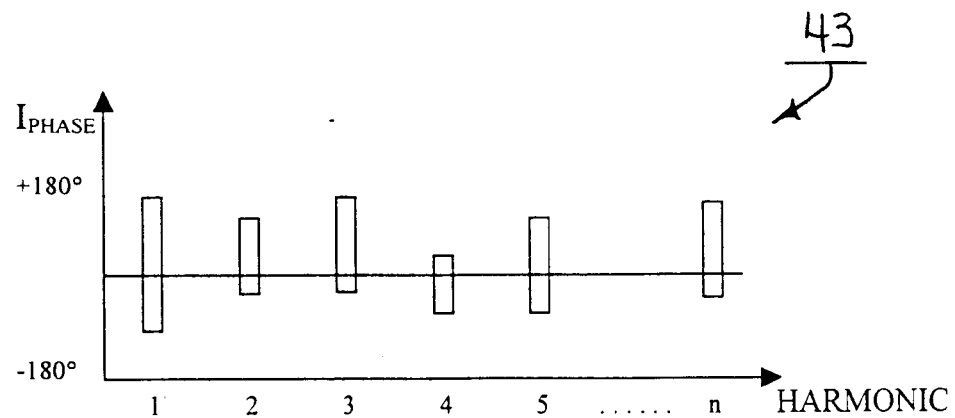

Referring to FIGS. 4A through 4C, diagrams graphically illustrating exemplary templates of harmonic data thresholds in accordance with principles of the present invention are shown.

FIG. 4A illustrates a first exemplary template 41 having thresholds for the magnitude level of the harmonics (i.e., 1–n) of a measured current signal. The harmonic thresholds shown in FIG. 4A may represent, for example, a condition where a given system or piece of equipment is susceptible to electrical damage. The specific harmonic threshold values may be defined and/or adjusted by a user. In particular, a user may manipulate keys or buttons of a programming device, not shown, that couples to the communication port 114 to define and/or adjust one or more threshold values. The programming device may be a portable computer or other portable programming device that is configured to operate in conjunction with the controller 108.

During the process of defining and/or adjusting the threshold values, a graphical illustration of the template 41 may be visually provided to the user via the display 112, or via a display of the programming device. Once the threshold values for a given template are set, the template data may be stored in memory such as non-volatile memory 110. A user may retrieve the stored template data from memory and adjust the threshold values as desired.

FIG. 4B illustrates a second exemplary template 42 having thresholds for the magnitude level of the harmonics (i.e., 1–n) a measured current signal. Like the template 41 of FIG. 4A, the thresholds shown in the template 42 of FIG. 4B may be defined and adjusted by a user via the communication port 114 and the display 112, and selectively stored and retrieved from non-volatile memory 110. The template 42 of FIG. 4B may represent, for example, a condition where a given system or piece of equipment is susceptible to electrical damage. Thus, as illustrated by FIGS. 4A and 4B, different templates may be defined to address different alarm conditions.

FIG. 4C illustrates a third exemplary template 43 having thresholds for the phase angle of the harmonics (i.e., 1–n) of a measured current signal. As is known in the art, an individual harmonic includes both a magnitude component and a phase angle component. The template 43 of FIG. 4C enables a user to establish thresholds for the phase angle component of one or more harmonics. In practice, a user may establish phase angle thresholds by defining a window (i.e., a range) within which the phase angle of each harmonic must fall. Like the templates 41 and 42 of FIGS. 4A and 4B, respectively, the thresholds shown in the template 43 of FIG. 4C may be defined and adjusted by a user via the communication port 114 and the display 112, and selectively stored and retrieved from the non-volatile memory 110. The template 43 of FIG. 4C may represent, for example, a condition where a given system or piece of equipment is susceptible to electrical damage.

It will be intuitive to those skilled in the art that thresholds for any desired number of harmonics, including higher harmonics, may be included in accordance with principles of the present invention. Moreover, it will be intuitive to those skilled in the art that similar template thresholds may also be constructed for voltage magnitude and voltage phase harmonics.

As previously indicated, it has been observed that certain templates may be created for certain types of devices or systems. For example, when the primary consumption of electrical power is attributable to rotating machines such as motors, specific templates may be created that are sensitive to pair patterns in harmonic content. That is, positive and negative sequence currents may occur in rotating machines when harmonic pairs such as the $5^{th}$ and $7^{th}$ harmonics or the $11^{th}$ and $13^{th}$ harmonics are present. Such interference may cause wear to the machine, and may additionally cause unstable operation such as hesitation or surging. However, the use of a proper template according to principles of the present invention can detect harmonic excesses at a specific site before significant damage or cost is incurred.

As a further example, when a meter includes communication functionality that involves a telephone system, it is necessary to avoid interference with the operation of the telephone system. Industry standards have been developed that define levels over which certain frequencies are deemed unacceptable and could cause interference with the telephone systems. Such electrical interference may be monitored by examining specific harmonic amplitudes as measured by weighting coefficients such as the known Telephone Interference Factor (TIF). Data communication applications may choose to modify one or more coefficients that are of significance for specific signals at a given site to design an optimal template. In this case, a dynamic range of 60 to 90 dB is considered useful.

Figure 5:
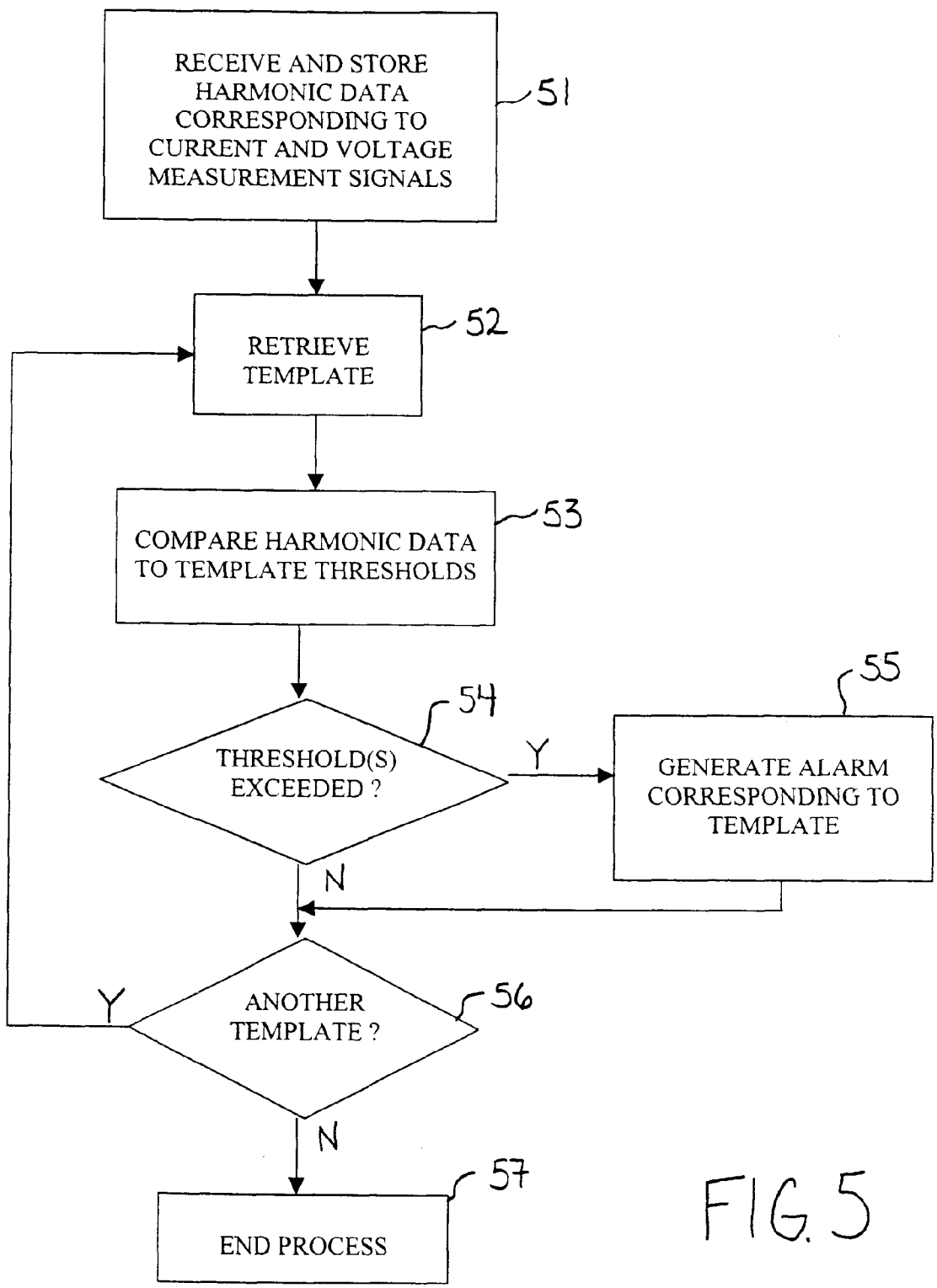
FIG. 5 is a flowchart illustrating exemplary steps for practicing the present invention with the electrical utility meter of FIG. 3.

Referring now to FIG. 5, a flowchart illustrating exemplary steps for practicing the present invention is shown. For purposes of example and explanation, the steps of FIG. 5 will be described in relation to the electrical utility meter 10 of FIG. 3. At step 51, the microcontroller 108 receives from the DSP 128 the harmonic information or data for the current and/or voltage measurement signals and stores the same in memory such as the non-volatile memory 110. At step 52, the microcontroller 108 retrieves a particular template from a memory such as the non-volatile memory 110. The retrieved template may, for example, be designated by a user via an input to the communication port 114 at the time of testing. Alternatively, the template may be retrieved in accordance with programming instructions stored in the non-volatile memory 110. As previously indicated, the retrieved template may include harmonic threshold values for current magnitude, current phase angle, voltage magnitude or voltage phase angle.

At step 53, the microcontroller 108 compares the harmonic information to the thresholds in the retrieved template. At step 54, the microcontroller 108 determines whether any of the template thresholds are exceeded by the valves in the corresponding valves in the harmonic information.

If one or more of the template thresholds are exceeded, process flow advances to step 55 where the microcontroller 108 enables an alarm to be generated. As previously indicated, the alarm generated preferably corresponds to the particular template whose thresholds are exceeded. For example, if the template exceeded corresponds to a particular piece of equipment (e.g., a motor), the site where the equipment is located may be contacted via telephone or other communication means to inform the site regarding the condition. In other instances, the site may be instructed to shutdown the equipment until further notification. In less severe situations, data regarding the template threshold violations may simply be stored in a memory such as the non-volatile memory 110 and communicated to the customer at a later time. The number and/or types of alarms that may be utilized in accordance with principles of the present invention is countless, and is simply a matter of design choice.

If it is determined that none of the template thresholds are exceeded at step 54, or after an alarm is generated at step 55, process flow advances to step 56 where the microcontroller 108 determines whether to use another template for harmonic threshold testing. This determination may be made, for example, in response to a user input to the communication port 114 at the time of testing, or in accordance with programming instructions stored in the non-volatile memory 110. According to an exemplary embodiment, the microcontroller 108 may be programmed to automatically utilize a plurality of templates according to designated time intervals. For example, the microcontroller 108 may be programmed to utilize a first template at a given time, and then to utilize the same template or a different template at a predetermined time thereafter. This type of repetitive template use may be desirable in certain instances, particularly where a given site uses one or more loads that need to be continually monitored. In any event, it is contemplated that various types of programming routines for template usage may be employed according to principles of the present invention.

When the microcontroller 108 decides to use another template for harmonic threshold testing at step 56, process flow loops back to step 52 and the above-described process is repeated for another template. Alternatively, when the microcontroller 108 decides not to use another template, process flow advances to step 57 where the process ends. As previously indicated, it is contemplated that the foregoing steps may be repeatedly performed at designated time intervals using the same and/or different templates.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for monitoring electrical conditions in a polyphase electrical system, comprising steps of:
   obtaining measured harmonic data for a plurality of phases in the polyphase electrical system;
   enabling selection of at least one of a plurality of predetermined templates including one or more harmonic data thresholds, each of the predetermined templates corresponding to a condition where a specific device is susceptible to electrical damage or interference;
   comparing the measured harmonic data with the one or more harmonic data thresholds included in the at least one selected predetermined template; and
   generating an alarm when the measured harmonic data exceeds the one or more harmonic data thresholds included in the at least one selected predetermined template.

2. The method of claim 1, wherein the one or more harmonic data thresholds are adjustable by a user.

3. The method of claim 1, wherein the alarm is generated in dependence upon the specific template whose one or more harmonic data thresholds are exceeded.

4. The method of claim 1, wherein the one or more harmonic data thresholds comprise a current magnitude for each harmonic of the measured harmonic data.

5. The method of claim 1, wherein the one or more harmonic data thresholds comprise a current phase angle range for each harmonic of the measured harmonic data.

6. The method of claim 1, wherein the one or more harmonic data thresholds comprise a voltage magnitude for each harmonic of the measured harmonic data.

7. The method of claim 1, wherein the one or more harmonic data thresholds comprise a voltage phase angle range for each harmonic of the measured harmonic data.

8. An electrical meter, comprising:
   circuitry for generating measured harmonic data for a plurality of phases in a polyphase electrical system;
   a communication port for enabling selection of at least one of a plurality of predetermined templates including one or more harmonic data thresholds, each of the predetermined templates corresponding to a condition where a specific device is susceptible to electrical damage or interference; and
   a processor for comparing the measured harmonic data with the one or more harmonic data thresholds included in the at least one selected predetermined template, and enabling generation of an alarm when the measured harmonic data exceeds the one or more harmonic data thresholds included in the at least one selected predetermined template.

9. The electrical meter of claim 8, wherein the one or more harmonic data thresholds are adjustable by a user.

10. The electrical meter of claim 8, wherein the alarm is generated in dependence upon the specific template whose one or more harmonic data thresholds are exceeded.

11. The electrical meter of claim 8, wherein the one or more harmonic data thresholds comprise a current magnitude for each harmonic of the measured harmonic data.

12. The electrical meter of claim 8, wherein the one or more harmonic data thresholds comprise a current phase angle range for each harmonic of the measured harmonic data.

13. The electrical meter of claim 8, wherein the one or more harmonic data thresholds comprise a voltage magnitude for each harmonic of the measured harmonic data.

14. The electrical meter of claim 8, wherein the one or more harmonic data thresholds comprise a voltage phase angle range for each harmonic of the measured harmonic data.

15. A method for monitoring electrical conditions in a polyphase electrical system, comprising steps of:
   selecting at least one of a plurality of predetermined templates, each of the plurality of predetermined templates including a set of one or more harmonic data thresholds;
   obtaining measured harmonic data for a plurality of phases in the polyphase electrical system;
   comparing the measured harmonic data with harmonic data thresholds included in the selected at least one of the plurality of predetermined templates; and
   generating an alarm when the measured harmonic data exceeds at least one harmonic data threshold included in the selected at least one of the plurality of predetermined templates.

16. The method of claim 15, wherein:
   selecting at least one of the plurality of predetermined templates further comprises selecting at least two templates of the plurality of predetermined templates; and
   the alarm is generated in dependence upon a template of the at least two templates whose at least one harmonic data threshold is exceeded.

17. The method of claim 15, wherein the harmonic data thresholds of the selected at least one plurality of predetermined templates are adjustable by a user.

18. The method of claim 15, wherein the harmonic data thresholds comprise a current magnitude for each harmonic of the measured harmonic data.

19. The method of claim 15, wherein the harmonic data thresholds comprise a current phase angle range for each harmonic of the measured harmonic data.

20. The method of claim 15, wherein the harmonic data thresholds comprise a voltage magnitude for each harmonic of the measured harmonic data.

21. The method of claim 15, wherein the harmonic data thresholds comprise a voltage phase angle range for each harmonic of the measured harmonic data.

22. An electrical meter, comprising:
   circuitry for generating measured harmonic data for a plurality of phases in a polyphase electrical system;

a memory for storing at least one selected template of a plurality of predetermined templates, each of the plurality of predetermined templates including a set of one or more harmonic data thresholds; and a processor for comparing the measured harmonic data with harmonic data thresholds included in the at least one selected template, and enabling generation of an alarm when the measured harmonic data exceeds at least one harmonic data threshold included in the at least one selected template.

23. The electrical meter of claim 22, wherein the harmonic data thresholds of the at least one selected template are adjustable by a user.

24. The electrical meter of claim 22, wherein:

the at least one selected template comprises a plurality of selected templates; and the alarm is generated in dependence upon a template of the plurality of selected templates whose at least one harmonic data threshold is exceeded.

25. The electrical meter of claim 22, wherein the harmonic data thresholds comprise a current magnitude for each harmonic of the measured harmonic data.

26. The electrical meter of claim 22, wherein the harmonic data thresholds comprise a current phase angle range for each harmonic of the measured harmonic data.

27. The electrical meter of claim 22, wherein the harmonic data thresholds comprise a voltage magnitude foil each harmonic of the measured harmonic data.

28. The electrical meter of claim 23, wherein the harmonic data thresholds comprise a voltage phase angle range for each harmonic of the measured harmonic data.

* * * * *